(12) United States Patent
Liou et al.

(10) Patent No.: US 8,471,376 B1
(45) Date of Patent: Jun. 25, 2013

(54) INTEGRATED CIRCUIT PACKAGING CONFIGURATIONS

(75) Inventors: Shiann-Ming Liou, Campbell, CA (US); Albert Wu, Palo Alto, CA (US)

(73) Assignee: Marvell International Ltd., Hamilton (BM)

( * ) Notice: Subject to any disclaimer, the term of this patent is extended or adjusted under 35 U.S.C. 154(b) by 387 days.

(21) Appl. No.: 12/774,908

(22) Filed: May 6, 2010

Related U.S. Application Data

(60) Provisional application No. 61/176,074, filed on May 6, 2009, provisional application No. 61/262,055, filed on Nov. 17, 2009.

(51) Int. Cl.
*H01L 23/52* (2006.01)

(52) U.S. Cl.
USPC .... 257/686; 257/698; 257/774; 257/E23.141; 257/E23.011; 257/E21.705; 438/109

(58) Field of Classification Search
USPC ... 257/678–733, 787–796, E23.001–E23.194
See application file for complete search history.

(56) References Cited

U.S. PATENT DOCUMENTS

| | | | | |
|---|---|---|---|---|
| 7,459,774 B2* | 12/2008 | Kwon et al. | | 257/686 |
| 7,723,159 B2* | 5/2010 | Do et al. | | 438/113 |
| 2002/0167079 A1* | 11/2002 | Pu et al. | | 257/685 |
| 2007/0290322 A1* | 12/2007 | Zhao et al. | | 257/690 |
| 2008/0315396 A1* | 12/2008 | Kuhlman et al. | | 257/692 |
| 2009/0200662 A1* | 8/2009 | Ng et al. | | 257/723 |
| 2009/0302435 A1* | 12/2009 | Pagaila et al. | | 257/659 |
| 2011/0024888 A1* | 2/2011 | Pagaila et al. | | 257/686 |
| 2011/0306168 A1* | 12/2011 | Pendse et al. | | 438/118 |

* cited by examiner

*Primary Examiner* — Mamadou Diallo

(57) ABSTRACT

Embodiments of the present disclosure provide a substrate, one of either a semiconductor die or an interposer disposed on the substrate, the semiconductor die or the interposer having a first surface attached to the substrate and a second surface that is opposite to the first surface, one or more interconnect structures formed on the second surface of the semiconductor die or the interposer, a mold compound formed to substantially encapsulate the semiconductor die or the interposer, and one or more vias formed in the mold compound to facilitate coupling the one or more interconnect structures with another component. Other embodiments may be described and/or claimed.

19 Claims, 10 Drawing Sheets

INTEGRATED CIRCUIT PACKAGING CONFIGURATIONS

CROSS REFERENCE TO RELATED APPLICATIONS

The present disclosure claims priority to U.S. Provisional Patent Application No. 61/176,074, filed May 6, 2009, and U.S. Provisional Patent Application No. 61/262,055, filed Nov. 17, 2009, the entire specifications of which are hereby incorporated by reference in their entireties for all purposes, except for those sections, if any, that are inconsistent with this specification.

TECHNICAL FIELD

Embodiments of the present disclosure relate to the field of integrated circuits, and more particularly, to integrated circuit packaging techniques and configurations.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Integrated circuit (IC) structures such as semiconductor devices and associated packaging components continue to shrink to smaller dimensions to provide higher densities of the IC structures per unit area. A variety of packaging configurations are emerging to address shrinking dimensions of IC structures in IC packages. For example, packaging configurations are emerging that include a stacked component such as a semiconductor die or IC package coupled to interconnect structures formed on a surface of a substrate (e.g., printed circuit board). However, as demand for smaller IC packages continues to grow, other IC packaging techniques and configurations are needed to provide even smaller form factors and higher density IC structures for stacked IC packages.

SUMMARY

The present disclosure provides an apparatus including a substrate and one of either a semiconductor die or an interposer disposed on the substrate. The semiconductor die or the interposer has a first surface attached to the substrate and a second surface that is opposite to the first surface. One or more interconnect structures are formed on the second surface of the semiconductor die or the interposer. A mold compound is formed to substantially encapsulate the semiconductor die or the interposer. One or more vias are formed in the mold compound to facilitate coupling the one or more interconnect structures with another component.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Embodiments herein are illustrated by way of example and not by way of limitation in the figures of the accompanying drawings.

DETAILED DESCRIPTION

Embodiments of the present disclosure describe IC packaging configurations. In the following detailed description, reference is made to the accompanying drawings which form a part hereof, wherein like numerals designate like parts throughout. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

The description may use perspective-based descriptions such as up/down, back/front, over/under, and top/bottom. Such descriptions are merely used to facilitate the discussion and are not intended to restrict the application of embodiments described herein to any particular orientation.

For the purposes of the present disclosure, the phrase "A/B" means A or B. For the purposes of the present disclosure, the phrase "A and/or B" means "(A), (B), or (A and B)." For the purposes of the present disclosure, the phrase "at least one of A, B, and C" means "(A), (B), (C), (A and B), (A and C), (B and C), or (A, B and C)." For the purposes of the present disclosure, the phrase "(A)B" means "(B) or (AB)" that is, A is an optional element.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The description uses the phrases "in an embodiment," "in embodiments," or similar language, which may each refer to one or more of the same or different embodiments. Furthermore, the terms "comprising," "including," "having," and the like, as used with respect to embodiments of the present disclosure, are synonymous.

Figure 1:
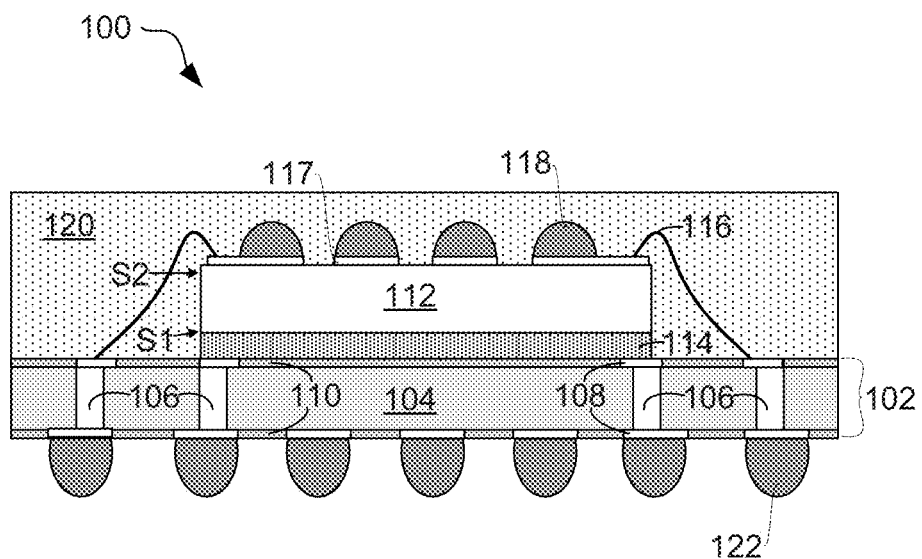
FIG. 1 schematically illustrates an IC package in a wire-bond configuration where the IC package is configured to receive another stacked component.

FIG. 1 schematically illustrates an IC package 100 in a wire-bond configuration where the IC package 100 is configured to receive another stacked component. The IC package 100 includes a substrate 102 and semiconductor die/interposer 112, coupled as shown. That is, label 112 is intended to represent either a semiconductor die or an interposer, according to various embodiments.

The substrate 102 includes a core 104 having one or more traces/bond pads 108 formed on opposite surfaces of the substrate 102. Label 108 is intended to represent traces and/or bond pads according to various embodiments. The traces/bond pads 108 are coupled to one or more via structures (e.g., substrate through-hole vias 106) to route electrical connections from the semiconductor die/interposer 112 to other electronic components using substrate interconnect structures (e.g., solder balls 122) that are formed on the substrate 102. For example, power and/or input/output (I/O) signals can be routed to or from the semiconductor die/interposer 112 using one or more bond wires 116 coupled to the traces/bond pads 108. The traces/bond pads 108 are further electrically coupled to the solder balls 122, e.g., using substrate through-hole vias 106. The solder balls 122 are configured on the substrate 102 such that the solder balls 122 can be electrically coupled with other electronic components such as a printed circuit board (e.g., motherboard).

Electrically insulative material such as solder mask 110 can be used to protect or electrically insulate the traces/bond pads 108 on the opposite surfaces of the substrate 102, as illustrated. Although not depicted, the substrate 102 can further include redistribution layers in the core 104 to route electrical pathways for the power or I/O signals.

The substrate 102 is intended to represent a variety of types of substrate such as laminate ("organic"), ceramic, or flex circuit. Subject matter is not limited in this regard and the substrate 102 can include any suitable substrate for mounting or otherwise receiving an electronic component such as a semiconductor die/interposer 112.

The semiconductor die/interposer 112 is disposed on the substrate 102 and can be attached to a surface of the substrate 102 using any suitable technique. For example, an adhesive 114 can be used to attach a first surface, S1, of the semiconductor die/interposer 112 to the substrate. In the wire-bond configuration of FIG. 1, the first surface S1 generally represents a backside or inactive side of a semiconductor die. The adhesive 114 can include a variety of materials such as an epoxy or silver paste, but is not limited to these example materials. The semiconductor die/interposer 112 is intended to represent a variety of types of semiconductor die or interposer including chips for memory or logic and/or any suitable electrical interface for routing electrical connections.

One or more interconnect structures 118 are formed on a second surface, S2, of the semiconductor die/interposer 112. The second surface S2 is opposite to the first surface S1, as illustrated. In the wire-bond configuration of FIG. 1, the second surface S2 represents a front side or active side of a semiconductor die. The active side is generally where one or more integrated circuit devices (e.g., transistors or memory cells) are formed.

The one or more interconnect structures 118 can include a variety of structures including, for example, solder balls, bumps, or metal posts. Generally, the one or more interconnect structures 118 include electrically and/or thermally conductive material to facilitate electrical or thermal coupling of the IC package 100 with another stacked component (e.g., component 250 of FIG. 2). One or more bond pads/traces 117 are generally formed on the semiconductor die/interposer 112 to provide an electrical pathway between the one or more interconnect structures 118 and other electrical coupling structures (e.g. one or more bond wires 116). Label 117 is intended to represent bond pads and/or traces according to various embodiments.

A mold compound 120 is formed to encapsulate the semiconductor die/interposer 112, as illustrated. The mold compound 120 generally protects the semiconductor die/interposer 112 from moisture and oxidation and provides a stronger, more robust IC package 100 by encapsulating and holding the semiconductor die/interposer 112 to the substrate 102. The mold compound 120 generally includes polymers such as epoxies, but materials for the mold compound 120 are not limited in this regard. Other suitable electrically insulative materials can be used to form a mold compound 120 in other embodiments.

Figure 2:
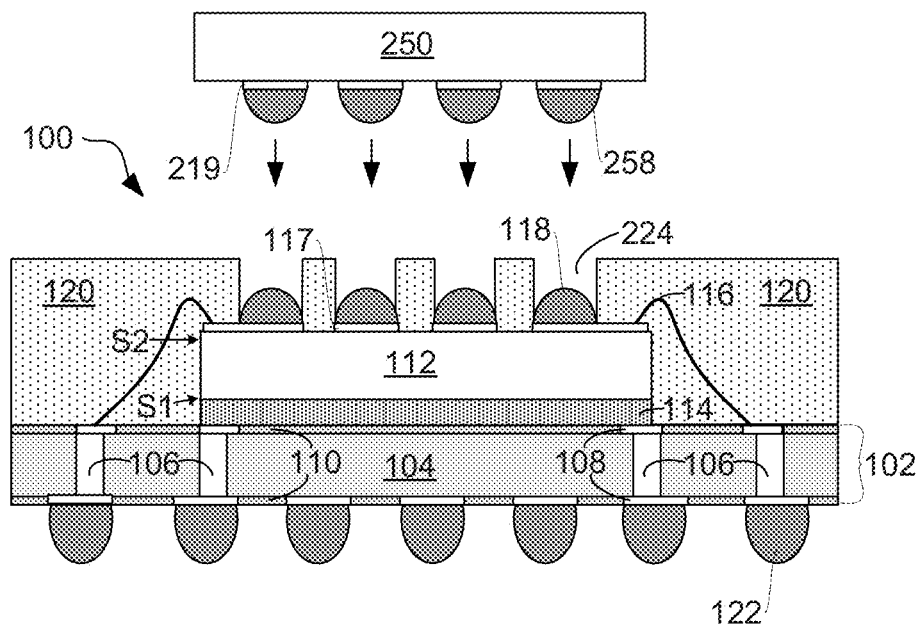
FIG. 2 schematically illustrates the IC package of FIG. 1 further including one or more vias to facilitate receiving another stacked component.

FIG. 2 schematically illustrates the IC package 100 of FIG. 1 further including one or more vias 224 to facilitate receiving another stacked component 250. In an embodiment, the one or more vias 224 are formed using a laser-drilling process to remove material from the mold compound 120. A via (e.g., via 224) may be formed for each interconnect structure of the one or more interconnect structures 118, as illustrated. After formation of the one or more vias 224, the IC package 100 of FIG. 2 is prepared to receive another stacked component (e.g., 250). That is, the one or more vias 224 formed in the mold compound 120 facilitate coupling of the one or more interconnect structures 118 with another component 250.

Another component 250 can include one or more interconnect structures (e.g., solder balls 258) that correspond with the one or more interconnect structures 118 formed on the semiconductor die/interposer 112 to facilitate electrical coupling of another component 250 to the one or more interconnect structures 118. In an embodiment, one or more bond pads 219 are generally formed on the component 250 to electrically couple the one or more interconnect structures (e.g, solder balls 258) with the component 250. In other embodiments, component 250 includes bond pads 219 that correspond with the one or more interconnect structures 118 and no solder balls 258 are used. In such embodiments, the mold compound 120 can be recessed to facilitate coupling of the bond pads 219 to the interconnect structures 118. Other types of well-known socket or interconnect configurations can be used to couple another component 250 to the IC package 100 in other embodiments.

An electrical connection is formed between the IC package 100 and another component 250 using the one or more interconnect structures 118 when the IC package 100 and another component 250 are coupled together. The electrical connection can provide, for example, an electrical pathway for power or I/O signals between another component 250 and the substrate 102. For example, one or more bond pads/traces 117 can be formed on the second surface S2 of the semiconductor die/interposer 112 to receive the one or more interconnect structures 118 and provide an electrical pathway between the one or more interconnect structures 118 and other electrical coupling structures. For example, the bond pads/traces 117 are electrically coupled to one or more bond wires 116 that are coupled to the substrate 102, as shown.

Another component 250 is intended to represent a variety of packaging structures including, for example, another semiconductor die or another IC package. In other embodiments, another component 250 represents a heat sink to dissipate heat from the semiconductor die/interposer 112 through the one or more interconnect structures 118.

Figure 3:
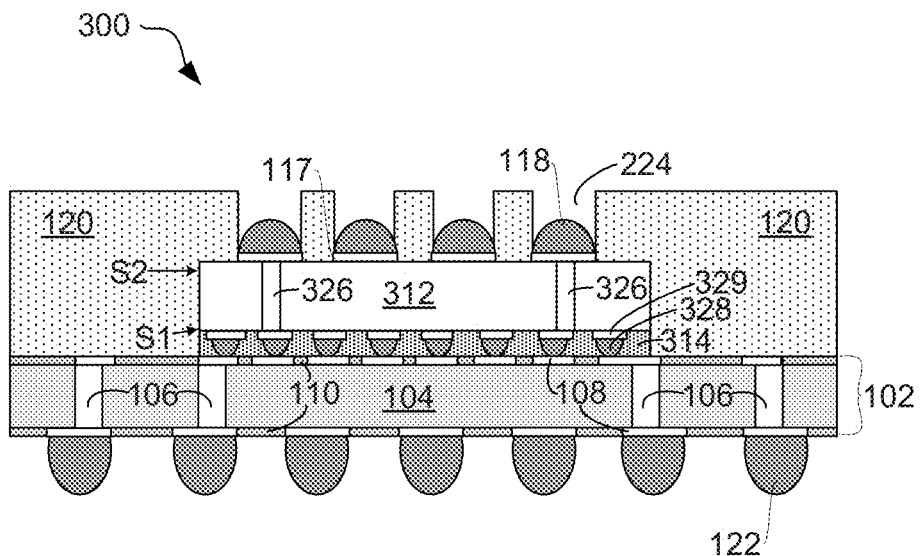
FIG. 3 schematically illustrates an IC package in a flip-chip configuration where the IC package is configured to receive another stacked component.

FIG. 3 schematically illustrates an IC package 300 in a flip-chip configuration where the IC package 300 is configured to receive another stacked component (e.g., component 250 of FIG. 2). In the flip-chip configuration, a first surface, S1, of a semiconductor die/interposer 312 is coupled to the substrate 102 using one or more interconnect structures 328 such as solder bumps and underfill 314. In the flip-chip configuration of FIG. 3, the first surface S1 represents a front side or active side of a semiconductor die where one or more integrated circuit devices (e.g., transistors or memory cells) are generally formed. The one or more interconnect structures 328 generally provide an electrical connection for power and/or I/O signals between the semiconductor die/interposer 312 and the substrate 102. One or more bond pads 329 may be formed on a surface of the semiconductor die/interposer 312 to provide an electrical pathway between the one or more interconnect structures 328 and the semiconductor die/interposer 312, as shown.

The underfill 314 substantially fills a region that is not occupied by the interconnect structures 328 between the semiconductor die/interposer 312 and the substrate 102, as illustrated. The underfill 314 can include a variety of electrically insulative materials such as an epoxy material. In other embodiments, the mold compound 120 performs the function of the underfill and fills the areas between the one or more interconnect structures 328. To be clear, the mold compound 120 can perform the function of the underfill for other embodiments described herein including IC packages 100, 400, 500, 600, or 700.

One or more interconnect structures 118 are formed on a second surface, S2, of the semiconductor die/interposer 312 to receive another stacked component on the IC package 300 (e.g., through the one or more vias 224 in the mold compound 120). In the flip-chip configuration, the second surface S2 represents a backside or inactive side of a semiconductor die.

In an embodiment, one or more vias 326 such as through-hole vias are formed through the semiconductor die/interposer 312 and filled with an electrically conductive material (e.g., copper) to electrically couple another stacked component (e.g., component 250 of FIG. 2) to the substrate 102 or to another electronic component (not shown) coupled to the substrate 102 by solder balls 122. For example the interconnect structures 118 can be directly coupled or coupled using intermediary structures (e.g., bond pads/traces) to the one or more vias 326. The one or more vias 326 are electrically coupled, directly or indirectly, to the one or more interconnect structures 328. The one or more interconnect structures 328 are electrically coupled to the substrate 102 and/or the solder balls 122 using electrical pathways described in connection with FIG. 1.

Figure 4:
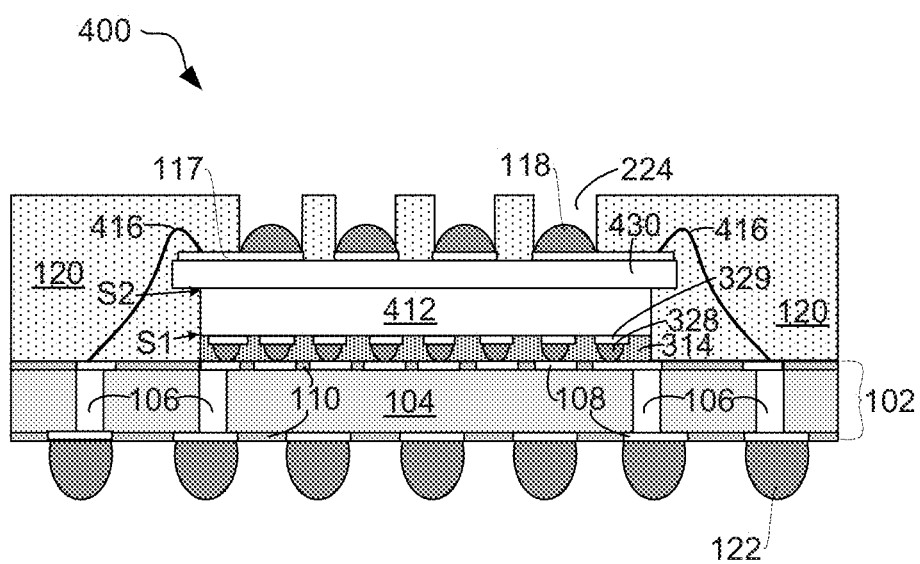
FIG. 4 schematically illustrates an IC package in a flip-chip interposer configuration where the IC package is configured to receive another stacked component.

FIG. 4 schematically illustrates an IC package 400 in a flip-chip interposer configuration where the IC package 400 is configured to receive another stacked component (e.g., component 250 of FIG. 2). In the flip-chip interposer configuration, a first surface, S1, of a semiconductor die 412 is coupled to the substrate 102 using one or more interconnect structures 328 such as solder bumps and underfill 314. In the flip-chip configuration, the first surface S1 represents a front side or active side of the semiconductor die 412.

An interposer 430 is coupled to a second surface, S2, of the semiconductor die 412 using any suitable method of attachment that is well-known in the art such as an adhesive. In the flip-chip configuration, the second surface S2 represents a backside or inactive side of the semiconductor die 412.

One or more interconnect structures 118 to receive another stacked component (e.g., component 250 of FIG. 2) are formed on the interposer 430, as shown. The interposer 430 is configured to route electrical connections between another stacked component to be electrically coupled to the one or more interconnect structures 118 and the substrate 102. For example, in the depicted embodiment, the interposer 416 is electrically coupled to the substrate 102 using one or more bond wires 416. Power and/or I/O signals of another stacked component can be routed to the substrate 102 through the one or more interconnect structures 118, the interposer 430 and the one or more bond wires 416.

In one embodiment, the IC package 400 is a fan-in IC package 400. In such an embodiment, the substrate 102 can be a substrate of a fan-in package-on-package (POP). Using vias 118 formed in the mold compound 120 may allow elimination of a dedicated mold tool that may be used to provide an opening on the interposer 430 for electrical coupling.

Figure 5:
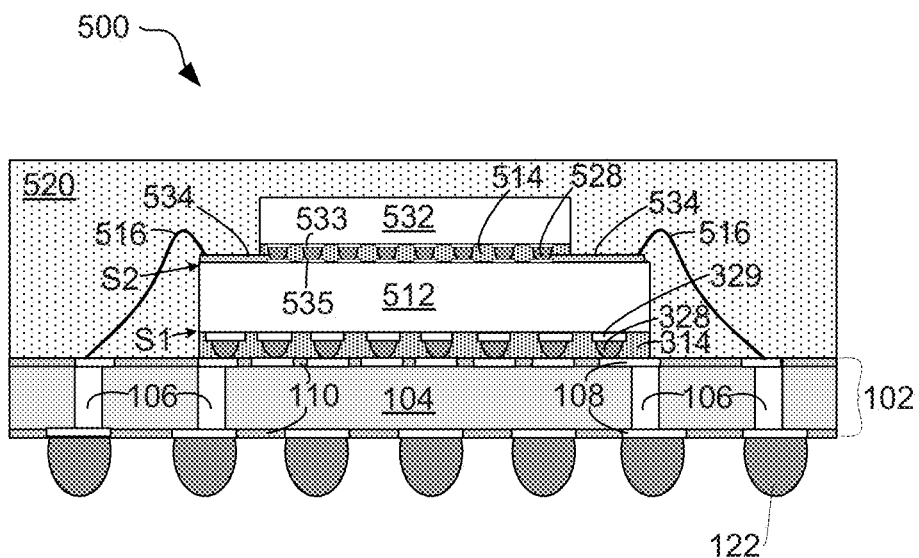
FIG. 5 schematically illustrates an IC package having a stacked dual flip-chip configuration and redistribution layer.

FIG. 5 schematically illustrates an IC package 500 having a stacked dual flip-chip configuration and redistribution layer 534. A first surface, S1, of the semiconductor die 512 is electrically coupled to the substrate 102. For example, power and/or I/O signals of the semiconductor die 512 can be routed to or from the substrate using one or more interconnect structures 328. In the flip-chip configuration, the first surface S1 of the semiconductor die 512 represents a front side or active side of a semiconductor die where one or more integrated circuit devices (e.g., transistors or memory cells) are generally formed.

Another semiconductor die 532 is stacked on or coupled to the semiconductor die 512 in a flip-chip configuration, as shown. According to various embodiments, one or more interconnect structures 528 are formed on either a second surface S2 of the semiconductor die 512 or on an active side of the semiconductor die 532, as illustrated. One or more bond pads 533 are generally formed on a surface (e.g., active side) of the semiconductor die 532 to provide an electrical pathway between the semiconductor die 532 and the one or more interconnect structures 528. One or more bond pads/traces 535 are formed on the second surface S2 of the semiconductor die 512 to provide an electrical pathway between the one or more interconnect structures 528 and other electrical coupling structures (e.g., redistribution layer 534 and/or bond wires 516). An underfill 514 or mold compound 520 may be deposited to substantially fill the region unoccupied by the one or more interconnect structures 528 between the semiconductor die 512 and the other semiconductor die 532.

A redistribution layer 534 is formed on the second side S2 of the semiconductor die 512 to route, at least in part, electrical signals between the other semiconductor die 532 (e.g., the stacked semiconductor die) and the substrate 102. For example, the redistribution layer 534 can include traces or similar structures that are electrically coupled to the one or more interconnect structures 528 to provide an electrical pathway for power and/or I/O signals to or from the other semiconductor die 532. One or more bond wires 516 are electrically coupled to the redistribution layer 534 on the second side S2 of the semiconductor die 512. The one or more bond wires 516 are further electrically coupled to the substrate 102 to provide an electrical pathway between the redistribution layer 534 and the substrate 102. Structures (e.g., redistribution layer 534, one or more bond wires 516, one or more interconnects 528, and bond pads/traces 535)) that are electrically coupled herein generally comprise an electrically conductive material such as metal.

Mold compound 520 is deposited to substantially encapsulate the semiconductor die 512 and the other semiconductor die 532, as shown. According to various embodiments, the mold compound 520 is deposited subsequent to attachment of the other semiconductor die 532 to the semiconductor die 512. To be clear, combinations of techniques or configurations as described in connection with FIGS. 1-4 and FIGS. 5-7 are envisioned and fall within the scope of the present disclosure.

Figure 6:
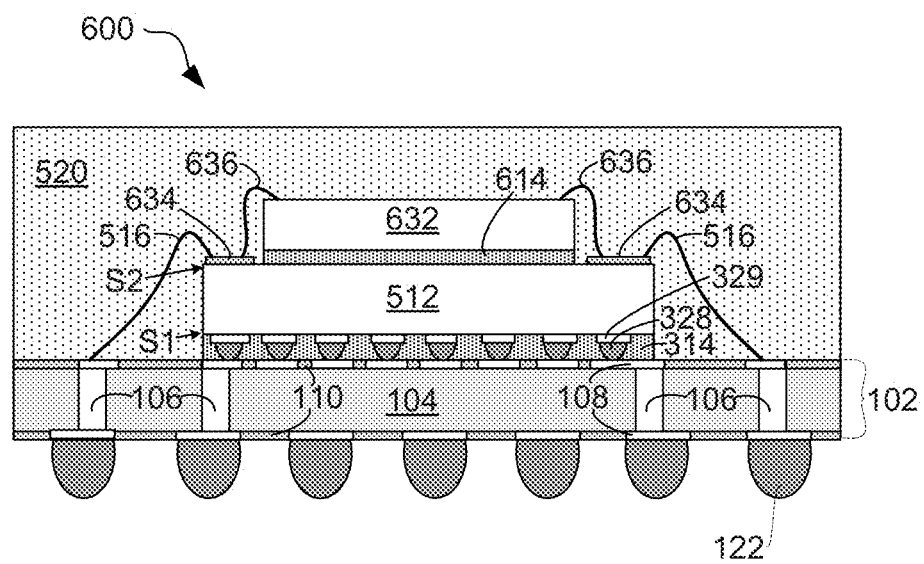
FIG. 6 schematically illustrates an IC package having a stacked combination flip-chip/wire-bond configuration and redistribution layer.

FIG. 6 schematically illustrates an IC package 600 having a stacked combination flip-chip/wire-bond configuration and redistribution layer 634. A first surface, S1, of the semiconductor die 512 is electrically coupled to the substrate 102 as shown in FIG. 5 where the first surface S1 of the semiconductor die 512 represents a front side or active side of a semiconductor die.

However, in FIG. 6, another semiconductor die 632 is stacked on or coupled to the semiconductor die 512 in a wire-bond configuration, as shown. An adhesive 614 can be used to attach a back side or inactive side of the other semiconductor die 632 to a second surface, S2, (e.g., inactive side) of the semiconductor die 512, as shown. A redistribution layer 634 is formed on the second side S2 of the semiconductor die 512 to route electrical signals such as power and/or I/O signals from the other die 632 to the substrate 102 using one or more bond wires 636 and one or more bond wires 516. The one or more bond wires 636 electrically couple an active surface of the other semiconductor die 632 to the redistribution layer 634 and the one or more bond wires 516 electrically couple the redistribution layer 634 to the substrate 102.

Figure 7:
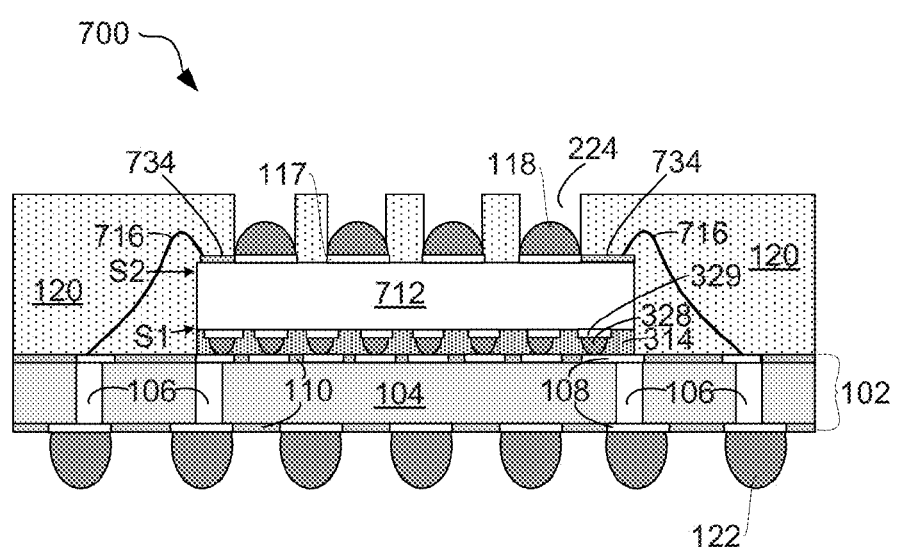
FIG. 7 schematically illustrates an IC package having a flip-chip configuration and redistribution layer, where the IC package is configured to receive another stacked component.

FIG. 7 schematically illustrates an IC package 700 having a flip-chip configuration and redistribution layer 734, where the IC package 700 is configured to receive another stacked component, in accordance with various embodiments. A first surface, S1 (e.g. active surface), of a semiconductor die 712 is coupled to the substrate 102 in a flip-chip configuration. One or more interconnect structures 118 (e.g., solder balls) are formed on a second surface, S2 (e.g., inactive surface), of a semiconductor die 712. The one or more interconnect structures 118 are configured to receive another stacked component (e.g., 250 of FIG. 2) through one or more vias 224 formed in the mold compound 120.

A redistribution layer 734 is formed on the second surface S2 to electrically couple the one or more interconnect structures 118 to one or more bond wires 716 that are electrically coupled to the substrate 102. The interconnect structures 118, the redistribution layer 734, and the one or more bond wires 716 form an electrical pathway between another component to be stacked on the semiconductor die 712 (e.g., using interconnect structures 118) and the substrate. The electrical pathway can be used for power and/or I/O signals. The IC package 700 may combine techniques and configurations for forming one or more vias 224 in the mold compound 120 as described in connection with, e.g., FIGS. 1-4 and using a redistribution layer 734 as described in connection with, e.g., FIGS. 5-6.

Figure 8:
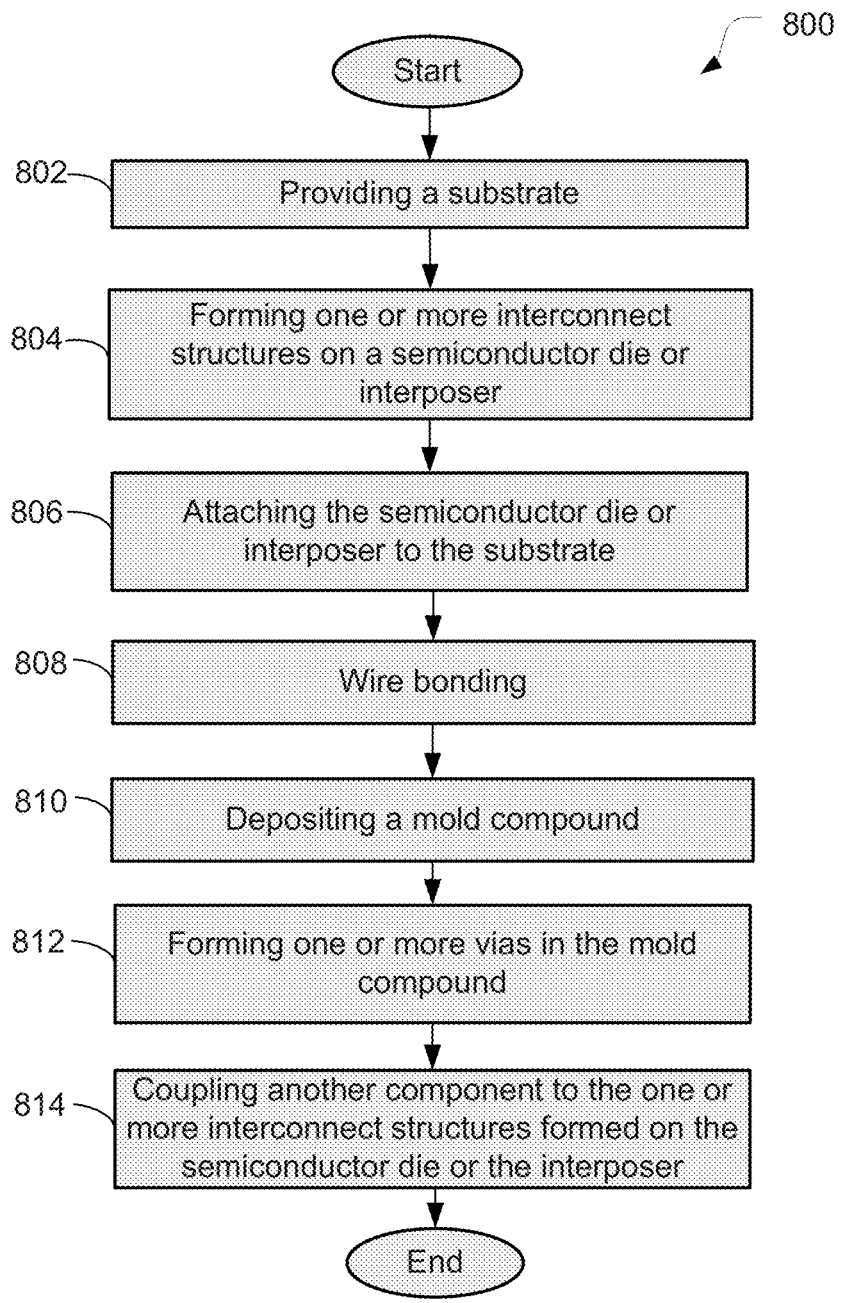
FIG. 8 schematically illustrates a flow diagram for a method of fabricating an IC package that is configured to receive another stacked component.

FIG. 8 schematically illustrates a flow diagram for a method 800 of fabricating an IC package (e.g., IC package 100 of FIG. 1) that is configured to receive another stacked component (e.g., component 250 of FIG. 2). At 802, the method 800 includes providing a substrate (e.g., substrate 102 of FIG. 1).

At 804, the method 800 further includes forming one or more interconnect structures (e.g., one or more interconnect structures 118 of FIG. 1) on a semiconductor die or interposer (e.g., interposer 112 of FIG. 1). In some embodiments, the one or more interconnect structures are formed by placing or depositing one or more solder balls on a surface of the semiconductor die or interposer according to configurations described herein. The one or more interconnect structures may be formed on the semiconductor die or interposer in wafer or single die format.

At 806, the method 800 further includes attaching the semiconductor die or interposer to the substrate. The semiconductor die or interposer can be attached using any suitable die attachment or surface mounting technique including, for example, wire-bonding at 808, as shown in FIGS. 1-2. The wire-bonding electrically couples the semiconductor die or interposer to the substrate. In other embodiments, the semiconductor die or interposer can be attached using a flip-chip configuration as shown in FIG. 3, or combinations thereof as shown in FIG. 4.

At 810, the method 800 further includes depositing a mold compound (e.g., mold compound 120 of FIG. 1). In an embodiment, the mold compound is deposited to substantially encapsulate the semiconductor die or the interposer and the one or more interconnect structures formed at 804.

At 812, the method 800 further includes forming one or more vias (e.g., via 224 of FIG. 2) in the mold compound. The one or more vias are formed to expose the one or more interconnect structures encapsulated in the mold compound. In an embodiment, a laser-drilling process is used to form one or more laser-drilled vias corresponding with the one or more interconnect structures to facilitate electrical or thermal coupling of another component with the one or more interconnect structures.

At 814, the method 800 further includes coupling another component (e.g., component 250 of FIG. 2) to the one or more interconnect structures formed on the semiconductor die or the interposer. The other component can be coupled using any suitable technique including solder or other metallic bonds. The other component can include, for example, another semiconductor die, another IC package, or a heat sink element.

Figure 9:
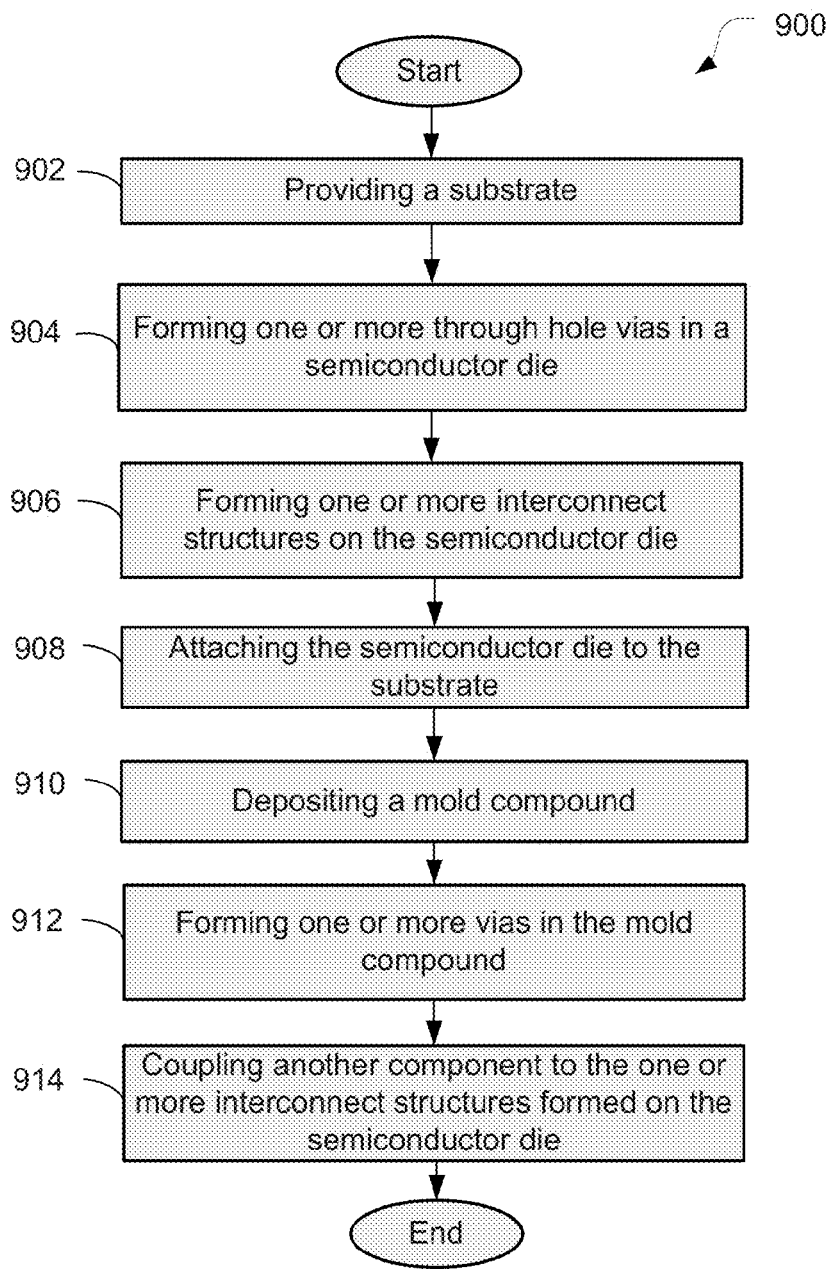
FIG. 9 schematically illustrates a flow diagram for another method of fabricating an IC package that is configured to receive another stacked component.

FIG. 9 schematically illustrates a flow diagram for another method 900 of fabricating an IC package (e.g., IC package 300 of FIG. 3) that is configured to receive another stacked component (e.g., component 250 of FIG. 2). At 902, the method 900 includes providing a substrate (e.g., substrate 102 of FIG. 3).

At 904, the method 900 further includes forming one or more through-hole vias (e.g., one or more through-hole vias 326 of FIG. 3) in a semiconductor die. The one or more through-hole vias can be formed, for example, by punching, drilling, or a laser process. The one or more through-hole vias are generally filled with an electrically conductive material to provide an electrical pathway through the semiconductor die. The through-hole vias can be formed, for example, when the semiconductor die is in wafer or single die format.

At 906, the method 900 further includes forming one or more interconnect structures on the semiconductor die. In an embodiment, a first set of interconnect structures (e.g., one or more interconnect structures 328 of FIG. 3) is formed on a first side (e.g., S1 of FIG. 3) of the semiconductor die and a second set of interconnect structures (e.g. one or more interconnect structures 118 of FIG. 3) is formed on a second side (e.g., S2 of FIG. 3) of the semiconductor die. In some embodiments, the first set of interconnect structures is formed by a bumping process such as controlled collapse chip connection (C4) and the second set of interconnect structures is formed by placing or depositing one or more solder balls on the semiconductor die. The one or more interconnect structures may be formed on the semiconductor die in wafer or single die format.

At 908, the method 900 further includes attaching the semiconductor die to the substrate. The semiconductor die can be attached using any suitable die attachment or surface mounting technique including, for example, a flip-chip configuration as shown in FIG. 3.

At 910, the method 900 further includes depositing a mold compound (e.g., mold compound 120 of FIG. 3). In an embodiment, the mold compound is deposited to substantially encapsulate the semiconductor die and/or the one or more interconnect structures formed at 904.

At 912, the method 900 further includes forming one or more vias (e.g., via 224 of FIG. 3) in the mold compound. The one or more vias are formed to expose the one or more interconnect structures (e.g., one or more interconnect structures 118 of FIG. 3) encapsulated in the mold compound. In an embodiment, a laser-drilling process is used to form one or more laser-drilled vias corresponding with the one or more interconnect structures to facilitate electrical or thermal coupling of another component with the one or more interconnect structures.

At 914, the method 900 further includes coupling another component (e.g., component 250 of FIG. 2) to the one or more interconnect structures formed on the semiconductor die. The other component can be coupled using any suitable technique including solder or other metallic bonds. The other component can include, for example, another semiconductor die, another IC package, or a heat sink element.

Figure 10:
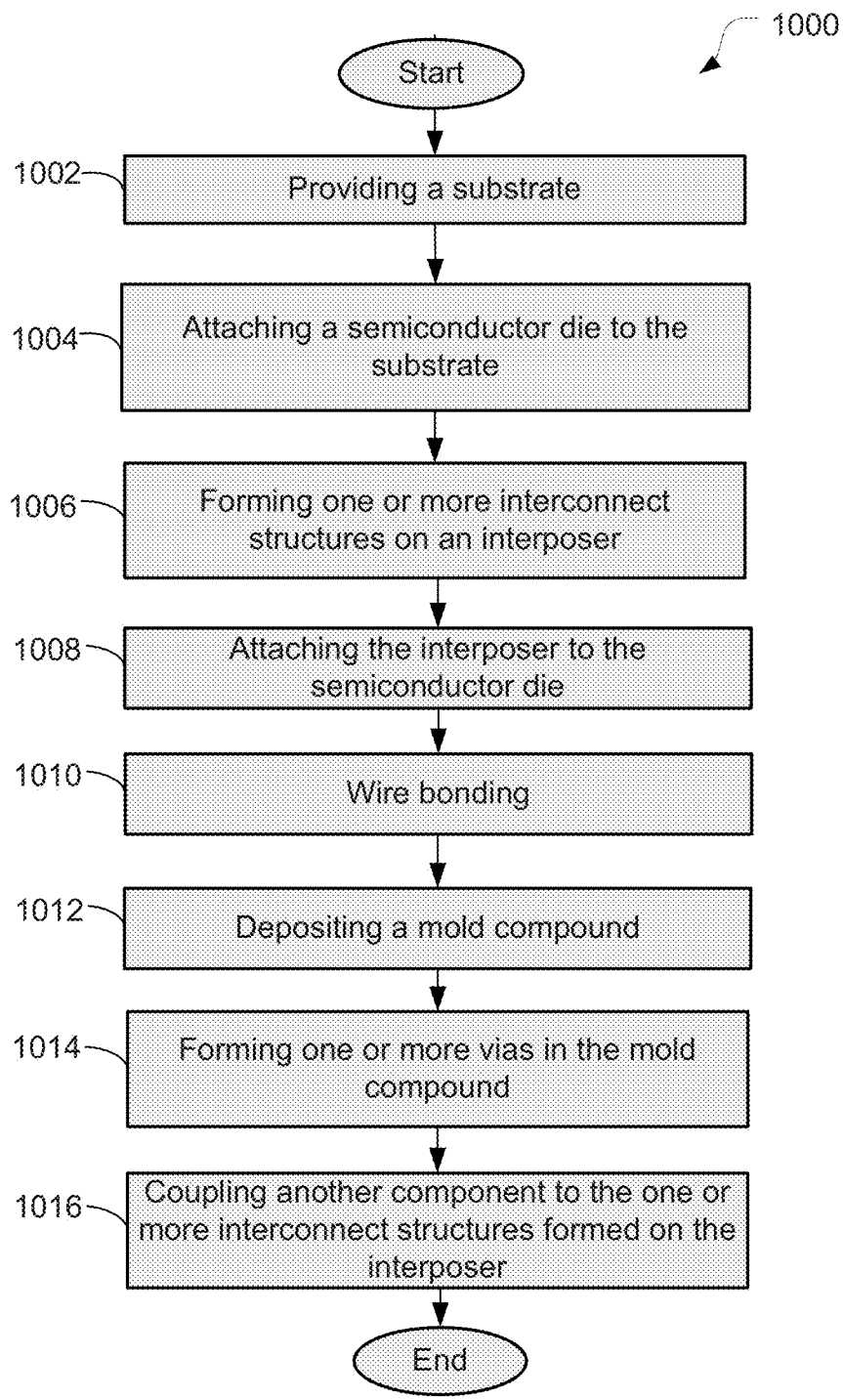
FIG. 10 schematically illustrates a flow diagram for yet another method of fabricating an IC package that is configured to receive another stacked component.

FIG. 10 schematically illustrates a flow diagram for yet another method 1000 of fabricating an IC package (e.g., IC package 400 of FIG. 4) that is configured to receive another stacked component (e.g., component 250 of FIG. 2). At 1002, the method 1000 includes providing a substrate (e.g., substrate 102 of FIG. 4).

At 1004, the method 1000 further includes attaching a semiconductor die (e.g., semiconductor die 412 of FIG. 4) to the substrate. The semiconductor die can be attached using any suitable die attachment or surface mounting technique including, for example, a flip-chip configuration as shown in FIG. 3. For example, one or more interconnect structures (e.g., one or more interconnect structures 328 of FIG. 4) may be formed on the semiconductor die to facilitate attachment of the semiconductor die to the substrate in a flip-chip configuration.

At 1006, the method 1000 further includes forming one or more interconnect structures (e.g., one or more interconnect structures 118 of FIG. 4) on an interposer (e.g., interposer 430 of FIG. 4). In an embodiment, the one or more interconnect structures are formed by placing or depositing one or more solder balls on the semiconductor die. The one or more interconnect structures may be formed on the semiconductor die in wafer or single die format.

At 1008, the method 1000 further includes attaching the interposer to the semiconductor die. The interposer can be coupled to the semiconductor die using any suitable technique, including using an adhesive such as, for example, epoxy.

At 1010, the method 1000 further includes wire bonding to couple the interposer to the substrate. One or more bond wires (e.g., one or more bond wires 416 of FIG. 4) can be used to electrically couple the interposer to the substrate. The one or more bond wires are electrically coupled to the one or more interconnects (e.g., using traces) to provide an electrically pathway between the one or more interconnects and the substrate.

At 1012, the method 1000 further includes depositing a mold compound (e.g., mold compound 120 of FIG. 4). In an embodiment, the mold compound is deposited to substantially encapsulate the semiconductor die and/or the one or more interconnect structures formed at 1006.

At 1014, the method 1000 further includes forming one or more vias (e.g., via 224 of FIG. 4) in the mold compound. The one or more vias are formed to expose the one or more interconnect structures encapsulated in the mold compound. In an embodiment, a laser-drilling process is used to form one or more laser-drilled vias corresponding with the one or more interconnect structures to facilitate electrical or thermal coupling of another component with the one or more interconnect structures.

At 1016, the method 1000 further includes coupling another component (e.g., component 250 of FIG. 2) to the one or more interconnect structures formed on the semiconductor die. The other component can be coupled using any suitable technique including solder or other metallic bonds. The other component can include, for example, another semiconductor die, another IC package, or a heat sink element.

Figure 11:
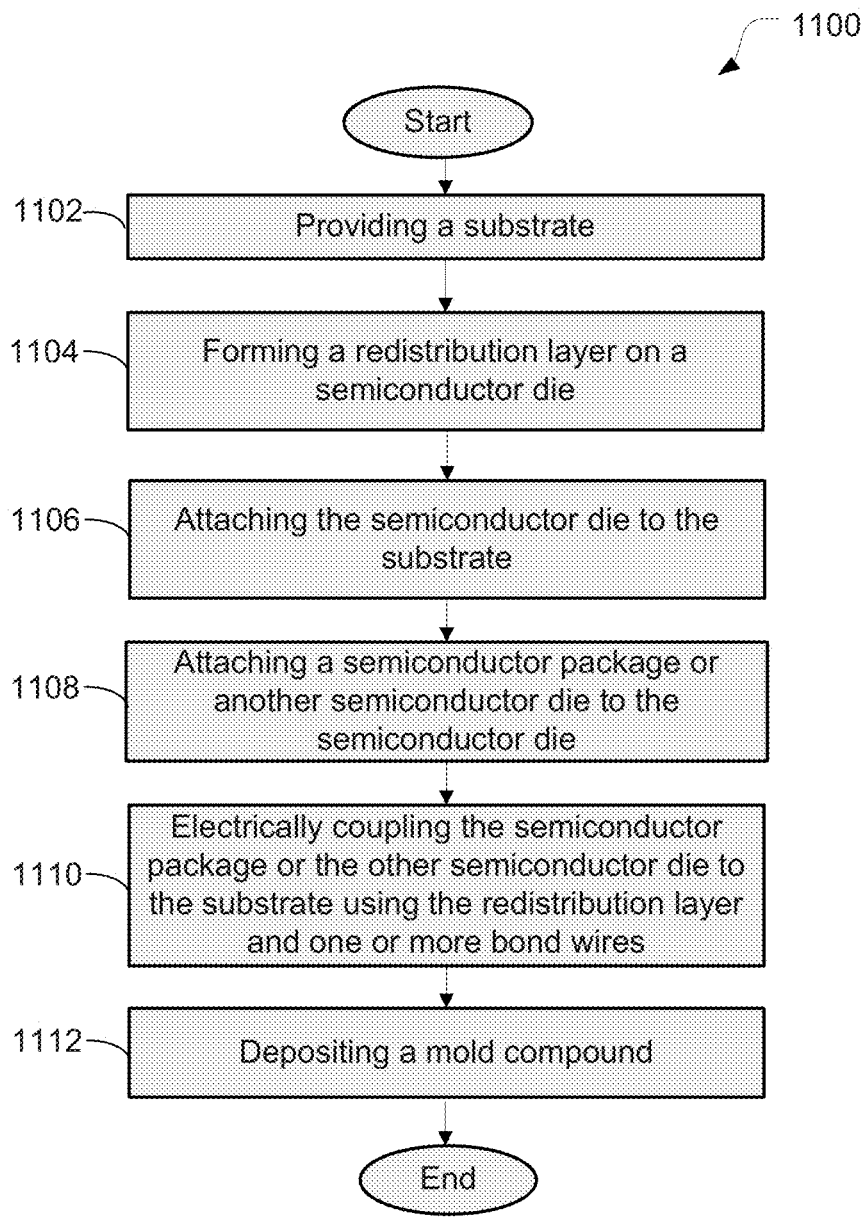
FIG. 11 schematically illustrates a flow diagram for a method of fabricating a stacked IC package having a redistribution layer.

FIG. 11 schematically illustrates a flow diagram for a method 1100 of fabricating a stacked IC package (e.g., IC package 500 or 600 respectively shown in FIG. 5 or 6) having a redistribution layer (e.g., redistribution layer 534 or 634 respectively shown in FIG. 5 or 6). At 1102, the method 1100 includes providing a substrate (e.g., substrate 102 of FIG. 5 or 6).

At 1104, the method 1100 further includes forming the redistribution layer on a semiconductor die (e.g., semiconductor die 512 of FIG. 5 or 6). According to various embodiments, the redistribution layer is formed on a backside or inactive side (e.g., S2 of FIG. 5 or 6) of the semiconductor die. The redistribution layer can include bond pads, traces, or other similar structures to electrically route signal paths such as power and/or I/O signals for a semiconductor package or another semiconductor die to be attached to or stacked on the semiconductor die. The redistribution layer can be formed using any of a variety of suitable techniques including well-known metal deposition and/or patterning techniques associated with semiconductor manufacturing. In one embodiment, one or more interconnect structures are formed on the active side (e.g., S1 of FIG. 5 or 6) to electrically couple the semiconductor die to the substrate in a flip-chip configuration.

At 1106, the method 1100 further includes attaching the semiconductor die to the substrate. The semiconductor die can be attached to the substrate using any suitable die attachment or surface mounting technique including, for example, flip-chip mounting.

At 1108, the method 1100 further includes attaching a semiconductor package or another semiconductor die (e.g., semiconductor package/another semiconductor die 532 or 632 respectively shown in FIG. 5 or 6) to the semiconductor die to form a stacked IC package (e.g., IC package 500 or 600 respectively shown in FIG. 5 or 6). The semiconductor package or the other semiconductor die can be attached using any suitable die attachment or surface mounting technique including, for example, flip-chip mounting as shown in FIG. 5 or wire-bonding as shown in FIG. 6.

At 1110, the method 1100 further includes electrically coupling the semiconductor package or the other semiconductor die to the substrate using the redistribution layer and one or more bond wires (e.g., one or more bond wires 516 or 636 respectively shown in FIG. 5 or 6). The bond wires can be formed using any suitable wire bonding process. According to various embodiments, the one or more bond wires are electrically coupled to the redistribution layer on a second surface (e.g., S2 of FIG. 5 or 6) of the semiconductor die and further electrically coupled to the substrate.

At 1112, the method 1100 further includes depositing a mold compound (e.g., mold compound 520 of FIG. 5 or 6). In an embodiment, the mold compound is deposited to encapsulate the semiconductor die attached to the substrate and the semiconductor package or other semiconductor die that is stacked on the semiconductor die.

Figure 12:
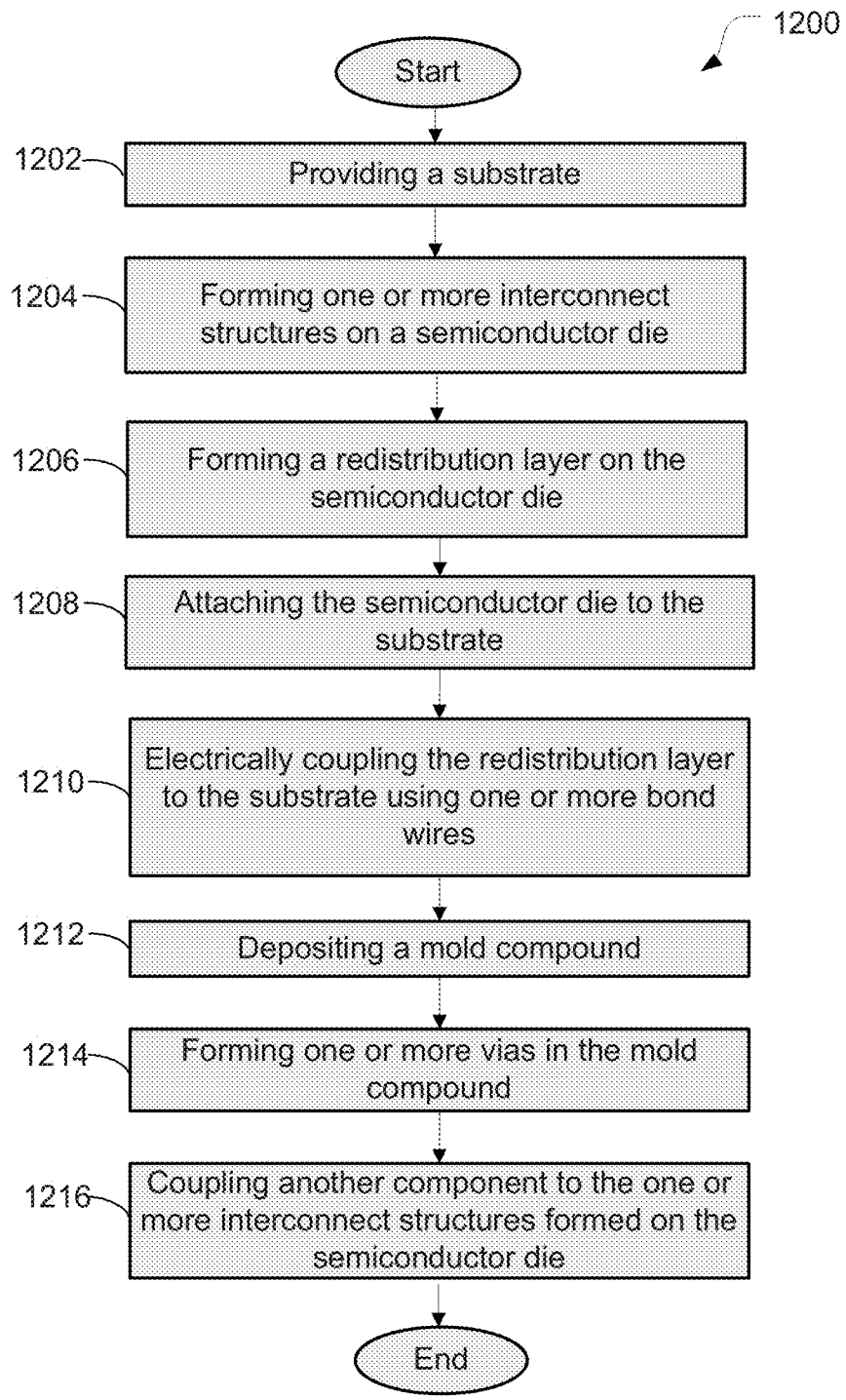
FIG. 12 schematically illustrates a flow diagram for another method of fabricating a stacked IC package having a redistribution layer.

FIG. 12 schematically illustrates a flow diagram for another method 1200 of fabricating a stacked IC package (e.g., IC package 700 of FIG. 7) having a redistribution layer (e.g., redistribution layer 734 of FIG. 7). At 1202, the method 1200 includes providing a substrate (e.g., substrate 102 of FIG. 7).

At 1204, the method 1200 further includes forming one or more interconnect structures on a semiconductor die (e.g., semiconductor die 712 of FIG. 7). In an embodiment, a first set of interconnect structures (e.g., one or more interconnect structures 328 of FIG. 7) is formed on a first side (e.g., S1 of FIG. 7) of the semiconductor die and a second set of interconnect structures (e.g. one or more interconnect structures 118 of FIG. 7) is formed on a second side (e.g., S2 of FIG. 7) of the semiconductor die. In some embodiments, the first set of interconnect structures is formed by a bumping process such as controlled collapse chip connection (C4) and the second set of interconnect structures is formed by placing or depositing one or more solder balls on the semiconductor die. The one or more interconnect structures may be formed on the semiconductor die in wafer or single die format.

At 1206, the method 1200 further includes forming the redistribution layer on the semiconductor die. According to various embodiments, the redistribution layer is formed on a backside or inactive side (e.g., S2 of FIG. 7) of the semiconductor die. The redistribution layer can include bond pads, traces, or other similar structures to electrically route signal paths such as power and/or I/O signals for a semiconductor package or another semiconductor die to be attached to or stacked on the semiconductor die. The redistribution layer is electrically coupled to the interconnect structures formed on the second surface (e.g., S2 of FIG. 7). The redistribution layer can be formed using any of a variety of suitable techniques including well-known metal deposition and/or patterning techniques associated with semiconductor manufacturing.

At 1208, the method 1200 further includes attaching the semiconductor die to the substrate. The semiconductor die can be attached to the substrate using any suitable die attachment or surface mounting technique including, for example, flip-chip mounting.

At 1210, the method 1200 further includes electrically coupling the redistribution layer to the substrate using one or more bond wires (e.g., one or more bond wires 716 of FIG. 7). The bond wires can be formed using any suitable wire bonding process. According to various embodiments, the one or more bond wires are electrically coupled to the redistribution layer on a second surface (e.g., S2 of FIG. 7) of the semiconductor die and further electrically coupled to the substrate.

At 1212, the method 1200 further includes depositing a mold compound (e.g., mold compound 120 of FIG. 7). In an embodiment, the mold compound is deposited to encapsulate the interconnect structures formed on the second surface of the semiconductor die.

At 1214, the method 1200 further includes forming one or more vias (e.g., via 224 of FIG. 7) in the mold compound. The one or more vias are formed to expose the one or more interconnect structures encapsulated in the mold compound. In an embodiment, a laser-drilling process is used to form one or more laser-drilled vias corresponding with the one or more interconnect structures to facilitate electrical or thermal coupling of another component with the one or more interconnect structures.

At 1216, the method 1200 further includes coupling another component (e.g., component 250 of FIG. 2) to the one or more exposed interconnect structures on the semiconductor die. The other component can be coupled using any suitable technique including solder or other metallic bonds. The other component can include, for example, another semiconductor die, another IC package, or a heat sink element.

Figure 13:
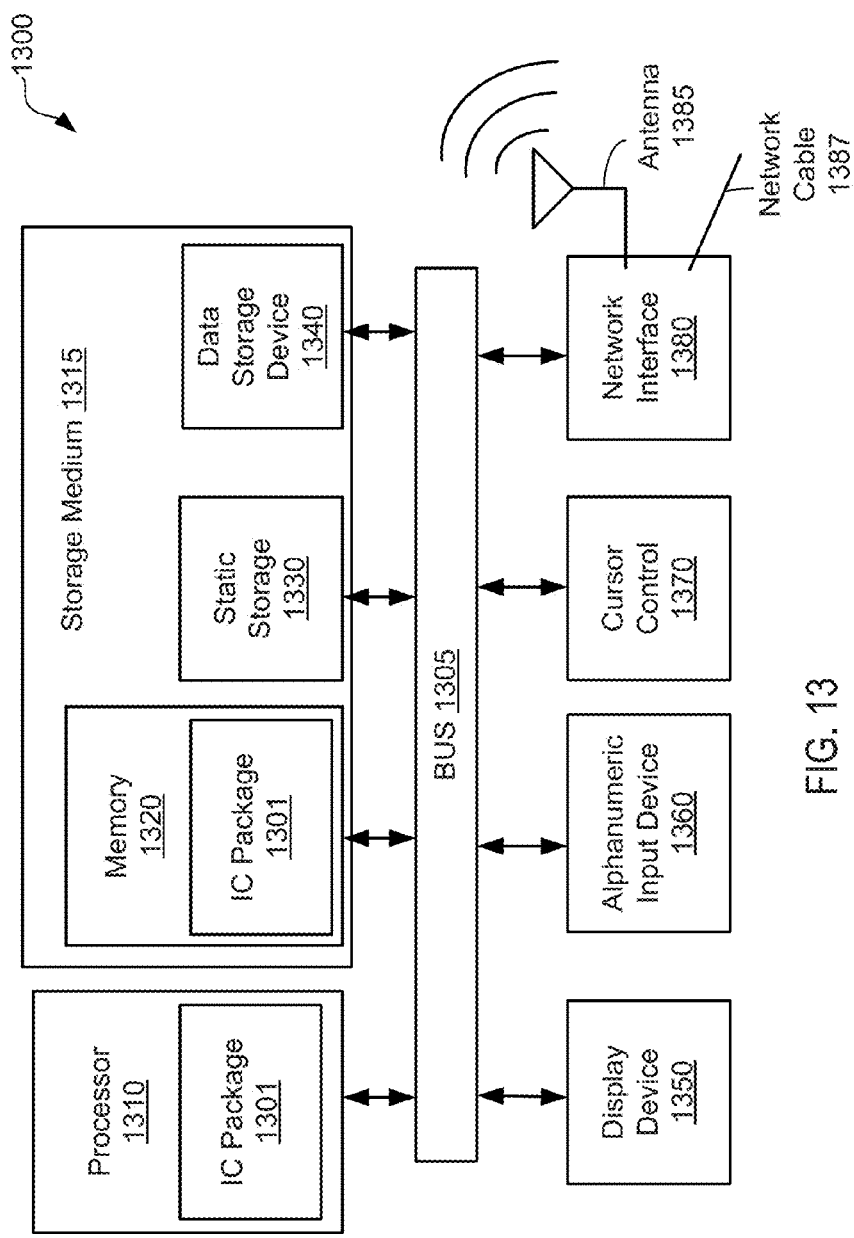
FIG. 13 schematically illustrates an electronic system configured to use an IC package as described herein.

FIG. 13 schematically illustrates an electronic system 1300 configured to use an IC package 1301 (e.g. an IC 100, 300, 400, 500, 600, or 700 as described herein), in accordance with various embodiments. Electronic system 1300 is intended to represent a range of electronic devices (either wired or wireless) including, for example, desktop computer devices, laptop computer devices, personal computers (PC), servers, printers, phones, personal digital assistants (PDA) including cellular-enabled PDAs, set top boxes, pocket PCs, tablet PCs, DVD players, video players, but is not limited to these examples and can include other electronic devices. Alternative electronic systems can include more, fewer and/or different components.

The electronic system 1300 includes a bus 1305 or other communication device or interface to communicate information, and processor 1310 coupled to the bus 1305 to process information. The bus 1305 can be a single system bus or a number of buses of the same or different types bridged together. The processor 1310 is representative of one or more processors and/or co-processors. In one embodiment, the processor 1310 includes or is part of an IC package 1301 as described herein.

The electronic system 1300 also includes a storage medium 1315, which can include various types of storage such as, for example, memory 1320, static storage 1330, and data storage device 1340. The storage medium 1315 is coupled to the bus 1305 to store information and/or instructions that are processed and/or executed by processor 1310. The storage medium 1315 can include more or less types of storage than depicted. In one embodiment, the storage medium 1315 includes or is part of an IC package 1301 as described herein. According to various embodiments, the processor 1310 and the memory 1320 are both part of an IC package 1301 as described herein (e.g., stacked semiconductor dies).

The electronic system 1300 includes random access memory (RAM) such as dynamic random access memory (DRAM) or other storage device 1320 (may be referred to as "memory"), coupled to the bus 1305. The memory 1320 may be used to store temporary variables or other intermediate information during execution of instructions by processor 1310. Memory 1320 can include, for example, a flash memory device. In one embodiment, memory 1320 includes a semiconductor die coupled to a flex circuit substrate in a package configuration as described herein.

The electronic system 1300 also includes read only memory (ROM) and/or other static storage device 1330 coupled to the bus 1305 to store static information and instructions for the processor 1310. Data storage device 1340 is coupled to the bus 1305 to store information and instructions. The data storage device 1340 can include, for example, a magnetic disk or optical disc and corresponding drive coupled with the electronic system 1300.

The electronic system 1300 is coupled via the bus 1305 to display device 1350, such as a cathode ray tube (CRT) or liquid crystal display (LCD), to display information to a user. Alphanumeric input device 1360, including alphanumeric and other keys, is coupled to the bus 1305 to communicate information and command selections to the processor 1310. Cursor control 1370 is another type of input device and includes, for example, a mouse, a trackball, or cursor direction keys to communicate information and command selections to the processor 1310 and to control cursor movement on the display 1350.

The electronic system 1300 further includes one or more network interfaces 1380 to provide access to network 1320, such as a local area network, but is not limited in this regard. The network interface 1380 can include, for example, a wireless network interface having antenna 1385, which may represent one or more antennae. The network interface 1380 can also include, for example, a wired network interface to communicate with remote devices via network cable 1387, which can be, for example, an Ethernet cable, a coaxial cable, a fiber optic cable, a serial cable, or a parallel cable.

Although certain embodiments have been illustrated and described herein, a wide variety of alternate and/or equivalent embodiments or implementations calculated to achieve the same purposes may be substituted for the embodiments illustrated and described without departing from the scope of the present disclosure. This disclosure is intended to cover any adaptations or variations of the embodiments discussed herein. Therefore, it is manifestly intended that embodiments described herein be limited only by the claims and the equivalents thereof.

What is claimed is:

1. An apparatus comprising:
   a substrate;
   a first component disposed on the substrate, wherein the first component is one of a semiconductor die or an interposer, wherein the first component has (i) a first surface coupled to the substrate and (ii) a second surface that is opposite to the first surface;
   a first one or more interconnect structures formed on the second surface of the first component;
   a mold compound formed to substantially encapsulate the first component;
   one or more vias formed in the mold compound to facilitate coupling the first one or more interconnect structures with a second component; and
   a second one or more interconnect structures formed on the first surface of the first component to electrically couple the first component with the substrate, wherein the second one or more interconnect structures are configured to route one or both of power signals and input/output signals between (i) the first component, and (ii) the substrate.

2. The apparatus of claim 1, wherein:
   the semiconductor die is a first semiconductor die;
   the interposer is a first interposer; and
   the second component is a second semiconductor die or an integrated circuit package.

3. The apparatus of claim 1, wherein the second component is a heat sink.

4. The apparatus of claim 1, wherein the first component is coupled to the substrate using a flip-chip configuration.

5. The apparatus of claim 1, wherein the first component further comprises one or more through-hole vias formed therein to electrically couple the first one or more interconnect structures formed on the second surface of the first component with the second one or more interconnect structures formed on the first surface of the first component.

6. The apparatus of claim 1, wherein:
   the first component is the interposer;
   the interposer is a first interposer;
   a second interposer is attached to the second surface of the first component, the second interposer being electrically coupled to the substrate using one or more bond wires; and
   the first one or more interconnect structures are formed on the second interposer.

7. The apparatus of claim 6, wherein the substrate is a substrate of a fan-in package-on-package (POP).

8. The apparatus of claim 1, wherein:
   the one or more vias comprise laser-drilled vias; and
   the first one or more interconnect structures comprise one or more solder balls.

9. The apparatus of claim 1, further comprising:
   a redistribution layer formed on the second surface of the first component, wherein the redistribution layer is electrically coupled to the first one or more interconnect structures.

10. The apparatus of claim 9, further comprising:
    one or more bond wires to provide an electrical connection between the redistribution layer and the substrate.

11. The apparatus of claim 10, wherein:
    the first component is the semiconductor die;
    the semiconductor die is a first semiconductor die;
    the second component is a second semiconductor die, wherein the second semiconductor die is coupled to the first component in a flip-chip configuration; and
    the redistribution layer is configured to route, at least in part, electrical signals between the second semiconductor die and the substrate.

12. The apparatus of claim 1, wherein:
    the semiconductor die is a first semiconductor die,
    the first one or more interconnect structures comprises a first one or more solder balls;
    the second component is a second semiconductor die, wherein a second one or more solder balls are formed on a surface of the second semiconductor die; and
    one of the first one or more solder balls is fused, through one of the one or more vias, with one of the second one or more solder balls.

13. A method comprising:
    providing a substrate;
    attaching a first surface of a first component to the substrate, wherein the first component is one of a semiconductor die or an interposer, wherein the first component has a second surface opposite to the first surface;
    forming a first one or more interconnect structures on the second surface of the first component;
    forming a second one or more interconnect structures on the first surface of the first component, wherein the second one or more interconnect structures are configured to route one or both of power signals and input/output signals between (i) the first component, and (ii) the substrate;
    depositing a mold compound to substantially encapsulate the first component; and
    forming one or more vias in the mold compound to facilitate coupling the first one or more interconnect structures with a second component.

14. The method of claim 13, wherein forming the one or more vias is performed using a laser-drilling process.

15. The method of claim 13, further comprising:
coupling the second component to the first one or more interconnect structures,
wherein the semiconductor die is a first semiconductor die, and wherein the second component is at least one of a second semiconductor die, an integrated circuit package, and a heat sink.

16. The method of claim 13, further comprising:
attaching one or more bond wires to the second surface of the first component to electrically couple the first component to the substrate.

17. The method of claim 13, further comprising:
forming one or more through-hole vias through the first component to provide an electrical connection between the first one or more interconnect structures formed on the first surface of the first component and the second one or more interconnect structures formed on the second surface of the first component.

18. The method of claim 13, further comprising:
forming a redistribution layer on the second surface of the first component, the redistribution layer being electrically coupled to the first one or more interconnect structures.

19. The method of claim 18, wherein the semiconductor die is a first semiconductor die, and wherein the second component is second semiconductor die, the method further comprising:
attaching one or more bond wires to the second surface of the first component to electrically couple the redistribution layer with the substrate;
wherein the redistribution layer is configured to route electrical signals to or from the second semiconductor die.

* * * * *